United States Patent
Kim et al.

(10) Patent No.: US 8,284,624 B2
(45) Date of Patent: Oct. 9, 2012

(54) LEVEL DETECTOR, INTERNAL VOLTAGE GENERATOR INCLUDING LEVEL DETECTOR, AND SEMICONDUCTOR MEMORY DEVICE INCLUDING INTERNAL VOLTAGE GENERATOR

(75) Inventors: Ki-Heung Kim, Suwon-si (KR); Yong-Ho Cho, Suwon-si (KR); Ji-Hoon Lim, Suwon-si (KR); Seong-Jin Jang, Seongnam-si (KR); Tae-Yoon Lee, Busan (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 340 days.

(21) Appl. No.: 12/691,910

(22) Filed: Jan. 22, 2010

(65) Prior Publication Data
US 2010/0195414 A1 Aug. 5, 2010

(30) Foreign Application Priority Data

Feb. 3, 2009 (KR) .................. 10-2009-0008576
Feb. 25, 2009 (KR) .................. 10-2009-0015959

(51) Int. Cl.
*G11C 7/04* (2006.01)
(52) U.S. Cl. ........ 365/212; 365/207; 365/208; 365/211; 327/52; 327/54; 327/56
(58) Field of Classification Search .......... 365/207, 365/208, 211, 212; 327/52, 54, 56
See application file for complete search history.

(56) References Cited

U.S. PATENT DOCUMENTS

| | | | |
|---|---|---|---|
| 5,434,533 A | 7/1995 | Furutani | |
| 2004/0207380 A1 | 10/2004 | Ariki | |
| 2005/0128821 A1* | 6/2005 | Kim et al. | 365/189.09 |
| 2007/0040579 A1* | 2/2007 | Jang | 326/81 |
| 2007/0241736 A1 | 10/2007 | Ogiwara et al. | |
| 2007/0274138 A1 | 11/2007 | Ogiwara et al. | |
| 2008/0175087 A1 | 7/2008 | Kim | |
| 2008/0279017 A1* | 11/2008 | Shimano et al. | 365/189.06 |

FOREIGN PATENT DOCUMENTS

| | | |
|---|---|---|
| JP | 05-289760 | 11/1993 |
| JP | 2004-318235 | 11/2004 |
| JP | 2007-279949 | 10/2007 |
| JP | 2007-280458 | 10/2007 |
| KR | 1993-0022368 | 11/1993 |
| KR | 1020040089433 | 10/2004 |
| KR | 1020080060322 | 7/2008 |
| KR | 1020080069387 | 7/2008 |

* cited by examiner

*Primary Examiner* — Hoai V Ho
*Assistant Examiner* — Jay Radke
(74) *Attorney, Agent, or Firm* — F. Chau & Associates, LLC (57) ABSTRACT

A level detector, an internal voltage generator including the level detector, and a semiconductor memory device including the internal voltage generator are provided. The internal voltage generator includes a level detector that compares a threshold voltage that varies with temperature with an internal voltage to output a comparative voltage, and an internal voltage driver that adjusts an external supply voltage in response to the comparative voltage and that outputs an internal voltage.

19 Claims, 8 Drawing Sheets

LEVEL DETECTOR, INTERNAL VOLTAGE GENERATOR INCLUDING LEVEL DETECTOR, AND SEMICONDUCTOR MEMORY DEVICE INCLUDING INTERNAL VOLTAGE GENERATOR

CROSS-REFERENCE TO RELATED APPLICATIONS

This application claims under 35 U.S.C. §119 priority to and the benefit of Korean Patent Application No. 10-2009-0008576, filed on Feb. 3, 2009, and Korean Patent Application No. 10-2009-0015959, filed on Feb. 25, 2009, the entire contents of both of which are incorporated by reference herein.

BACKGROUND

1. Technical Field

The present disclosure relates to level detectors, and more particularly, to a level detector having a threshold voltage that varies with temperature, an internal voltage generator that includes the level detector, and a semiconductor memory device that includes the internal voltage generator.

2. Discussion of Related Art

A level detector is a circuit for determining whether the voltage level of a specific signal is higher than a threshold voltage and for outputting a signal according to the result of the determination. The level detector is widely utilized for semiconductor devices. For example, the level detector is used to compare the level of an internal voltage generated by an internal voltage generator with the level of a threshold voltage (or a reference voltage). That is, the internal voltage generator increases the internal voltage when the level detector detects that the internal voltage is lower than the threshold voltage (or the reference voltage) and decreases the internal voltage when the level detector detects that the internal voltage is higher than the threshold voltage (or the reference voltage).

The internal voltage generated by the internal voltage generator can be used as a supply voltage for internal circuits of a semiconductor device. That is, the internal voltage may be supplied to a memory cell array in the semiconductor memory device or may be used as a supply voltage for a word line drive circuit or a delay circuit for adjusting the timing of a control signal (e.g., a delay time from the activation of a word line enable signal to the activation of a sense amplifier enable signal).

However, in many applications, the threshold voltage needs to vary with temperature. For example, in a semiconductor memory device, an internal voltage supplied to a delay circuit, which is used to obtain a delay time needed to generate a sense amplifier enable signal after a word line is activated, needs to have a lower level at low temperature than at high temperature to obtain a sensing margin. In this case, a level detector in the internal voltage generator needs to have a lower threshold voltage at low temperature than at high temperature.

SUMMARY

Exemplary embodiments provide a level detector having a threshold voltage that varies with temperature.

Exemplary embodiments also provide an internal voltage generator having a level detector for generating an internal voltage that varies with temperature.

Exemplary embodiments also provide a semiconductor memory device having the internal voltage generator.

In accordance with an exemplary embodiment of the inventive concept, a level detector includes a differential amplifying unit configured to output a differentially amplified comparative voltage at a second node in response to a voltage at a first node wherein the comparative voltage varies based upon a difference between a reference voltage and a sensed voltage, and a temperature coefficient adjustment unit configured to control current that flows through the first node in response to a variable voltage having a level that varies with temperature, and to control current that flows through the second node in response to a fixed voltage having a level that does not vary with temperature.

The differential amplifying unit may include a reference voltage generator configured to receive an external constant voltage and to output the reference voltage, a sensed voltage generator configured to output the sensed voltage in response to an input voltage, and a differential amplifier that is driven by a first current source and configured to output a voltage at the second node that varies based upon the voltage at the first node, as the differentially amplified comparative voltage. The reference voltage and the sensed voltage may not vary with temperature.

The temperature coefficient adjustment unit may include a variable voltage generator configured to receive the constant voltage and to output the variable voltage that varies with temperature, a fixed voltage generator configured to receive the constant voltage and to output the fixed voltage, a current controller connected between the first node and the second node and a fourth node, and configured to control current that flows from the first node to the fourth node in response to the variable voltage, and to control current that flows from the second node to the fourth node in response to the fixed voltage, and a second current source connected between the fourth node and a ground voltage for driving the current controller.

The variable voltage generator may include a first variable resistance unit connected between the constant voltage and an output node for the variable voltage and having a resistance that varies with temperature, and a second variable resistance unit connected between the output node for the variable voltage and the ground voltage and having a resistance that varies with temperature.

The level detector may further include an output unit having a PMOS transistor connected between the supply voltage and an output terminal for an output signal and having a gate to which the differentially amplified comparative voltage is applied, and a third current source connected between the output terminal for the output signal and the ground voltage. The first current source may be a constant current source, and the second current source and the third current source may be variable current sources. The third current source may increase current that flows from the output terminal for the output signal to the ground voltage when current generated by the second current source increases and may decrease current that flows from the output terminal for the output signal to the ground voltage when the current generated by the second current source decreases.

In accordance with an exemplary embodiment of the inventive concept an internal voltage generator includes a level detector configured to compare an internal voltage with a threshold voltage that varies based upon temperature and to output a comparative voltage, and an internal voltage driver configured to adjust an internal voltage relative to an external supply voltage in response to the comparative voltage and to output the internal voltage.

The level detector may include a comparative voltage generator configured to output the comparative voltage in response to a difference between a reference voltage and a sensed voltage, and a sensed voltage generator comprising a first resistance unit and a second resistance unit connected in series between an output node for the internal voltage and a ground voltage and that outputs outputting the sensed voltage that varies with temperature. The second resistance unit may have a resistance that varies with temperature.

The second resistance unit may include a PMOS transistor having a gate to which the ground voltage is applied and having a high threshold voltage, the resistance of the second resistance unit being configured to increase when temperature decreases.

Alternatively, the second resistance unit may include an NMOS transistor having a gate to which the internal voltage is applied and having a low threshold voltage, the resistance of the second resistance unit being configured to decrease when temperature decreases.

Alternatively, the level detector may include a differential amplifying unit configured to output a differentially amplified comparative voltage to a second node in response to a voltage at a first node that varies based upon a difference between a reference voltage and a sensed voltage, and a temperature coefficient adjustment unit configured to control current that flows through the first node in response to a variable voltage having a level that varies with temperature, and to control current that flows through the second node in response to a fixed voltage having a level that does not vary with temperature.

The differential amplifying unit may include a reference voltage generator configured to receive an external constant voltage and output the reference voltage, a sensed voltage generator configured to output the sensed voltage in response to the internal voltage, and a differential amplifier driven by a first current source, and configured to output a voltage at the second node that varies based upon the voltage at the first node, as a comparative voltage. The reference voltage and the sensed voltage may not vary with temperature.

The temperature coefficient adjustment unit may include a variable voltage generator configured to receive the constant voltage and output the variable voltage that varies with temperature, a fixed voltage generator configured to receive the constant voltage and output the fixed voltage, a current controller connected between the first node and the second node and a third node, and configured to control current that flows from the first node to the third node in response to the variable voltage and to control current that flows from the second node to the third node in response to the fixed voltage, and a second current source connected between the third node and a ground voltage for driving the current controller.

The internal voltage driver may include a PMOS transistor connected between the supply voltage and an output terminal for the internal voltage and having a gate to which the comparative voltage is applied, and a third current source connected between the output terminal for the internal voltage and the ground voltage. The first current source may be a constant current source, and the second current source and the third current source may be variable current sources. The third current source may increase current that flows from the output terminal for an output signal to the ground voltage when current generated by the second current source increases and may decrease current that flows from the output terminal for an output signal to the ground voltage when the current generated by the second current source decreases.

In accordance with an exemplary embodiment of the inventive concept a semiconductor memory device includes a memory cell array comprising a plurality of memory cells connected between a plurality of word lines and a plurality of bit lines, a sense amplifier configured to sense and to amplify a signal on a corresponding bit line of the plurality of bit lines in response to a sense enable signal, a controller configured to receive an internal voltage, to drive a corresponding word line of the plurality of word lines in response to an external command, and to output the sense enable signal, and an internal voltage generator generating the internal voltage. The internal voltage generator includes a level detector configured to compare a threshold voltage that varies with temperature and the internal voltage to output a comparative voltage, and an internal voltage driver configured to input an external supply voltage and output the internal voltage in response to the comparative voltage.

The internal voltage generator may be configured to output an internal voltage that is lower at low temperature than the internal voltage that is output at high temperature. The controller may be configured to adjust a delay time until the sense enable signal is output after the word line is driven, using the internal voltage.

Alternatively the internal voltage generator may be configured to output an internal voltage that is lower at high temperature than the internal voltage that is output at low temperature, and the controller may drive the word line using the internal voltage.

The level detector may include a comparative voltage generator configured to output the comparative voltage in response to a difference between a reference voltage and a sensed voltage, and a sensed voltage generator comprising a first resistance unit and a second resistance unit connected in series between an output node for the internal voltage and a ground voltage and that outputs the sensed voltage that varies with temperature. The second resistance unit may have a resistance that varies with temperature.

Alternatively, the level detector may include a differential amplifying unit configured to output a differentially amplified comparative voltage at a second node in response to a voltage at a first node that varies with a difference between a reference voltage and a sensed voltage, and a temperature coefficient adjustment unit configured to control current that flows through the first node in response to a variable voltage having a level that varies with temperature, and to control current that flows through the second node in response to a fixed voltage having a level that does not vary with temperature.

The differential amplifying unit may include a reference voltage generator configured to receive an external constant voltage and to output the reference voltage that does not vary with temperature, a sensed voltage generator configured to output the sensed voltage that does not vary with temperature in response to the internal voltage, and a differential amplifier driven by a first current source, and configured to output a voltage at the second node that varies with the voltage at the first node, as a comparative voltage. The temperature coefficient adjustment unit may include a variable voltage generator configured to receive the external constant voltage and output the variable voltage that varies with temperature, a fixed voltage generator configured to receive the external constant voltage and to output the fixed voltage, a current controller connected between the first and second nodes and a fourth node, and configured to control current that flows from one the first node to the fourth node in response to the variable voltage and to control current that flows from the second node to the fourth node in response to the fixed voltage, and a second current source connected between the fourth node and a ground voltage for driving the current controller.

The internal voltage driver may include a PMOS transistor connected between the supply voltage and an output terminal for the internal voltage and having a gate to which the comparative voltage is applied, and a third current source connected between the output terminal for the internal voltage and the ground voltage. The first current source may be a constant current source and the second current source and the third current source may be variable current sources. The third current source may increase current that flows from the output terminal for an output signal to the ground voltage when current generated by the second current source increases and may decrease current that flows from the output terminal for an output signal to the ground voltage when the current generated by the second current source decreases.

BRIEF DESCRIPTION OF THE DRAWINGS

Exemplary embodiments are described in further detail below with reference to the accompanying drawings.

DETAILED DESCRIPTION OF THE EXEMPLARY EMBODIMENTS

Various exemplary embodiments will now be described more fully with reference to the accompanying drawings in which exemplary embodiments are shown. Specific structural and functional details disclosed herein are merely representative for purposes of describing the exemplary embodiments. The present inventive concept, however, may be embodied in many alternate forms and should not be construed as limited to only the exemplary embodiments set forth herein. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. Other words used to describe the relationship between elements should be interpreted in a like fashion (e.g., "between" versus "directly between," "adjacent" versus "directly adjacent," etc.).

Figure 1:
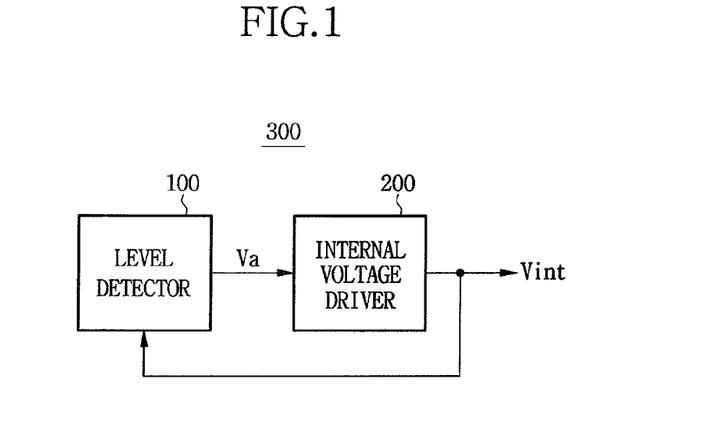
FIG. 1 illustrates a block diagram of an internal voltage generator having a level detector according to an exemplary embodiment of the inventive concept.

FIG. 1 illustrates a block diagram of an internal voltage generator 300 including a level detector 100 according to an exemplary embodiment of the inventive concept. An internal voltage generator 300 may include a level detector 100 and an internal voltage driver 200.

The level detector 100 compares an internal voltage Vint with a threshold voltage that varies with temperature and outputs a comparative voltage Va according to a result of the comparison. For example, the level detector 100 may be configured to have a variable threshold voltage using the resistance of a transistor that varies with temperature.

The internal voltage driver 200 drives the internal voltage Vint in response to the comparative voltage Va.

Figure 2:
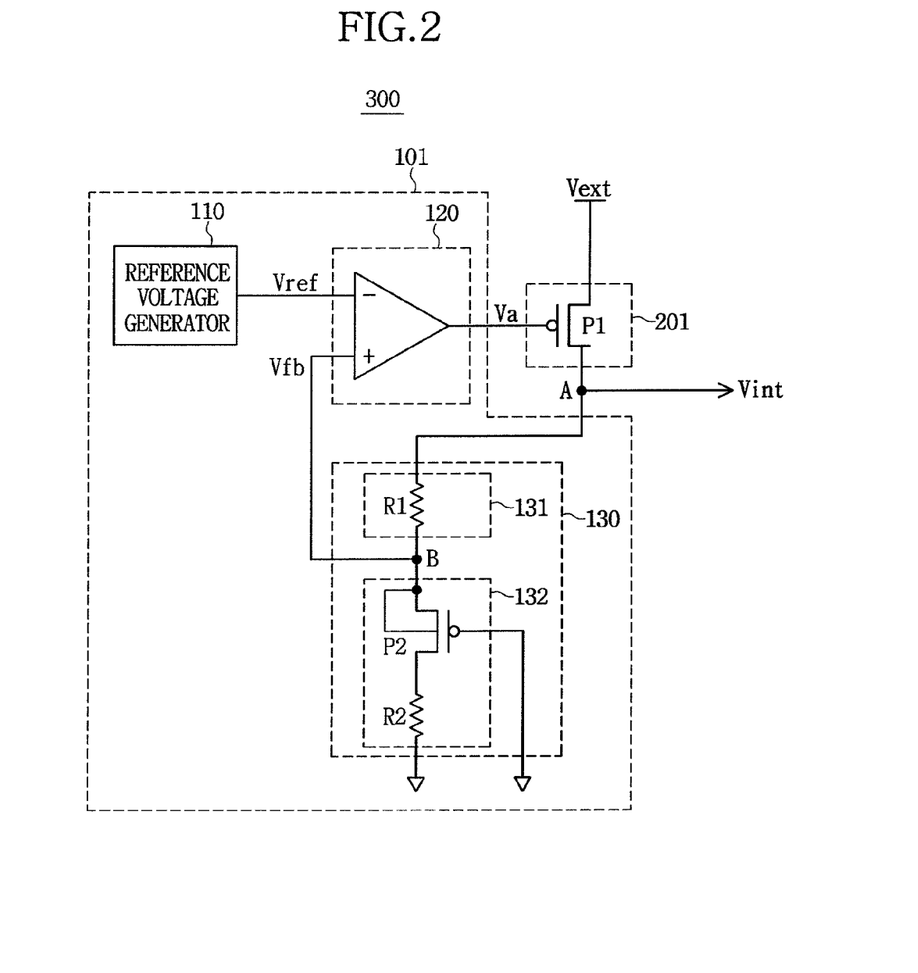
FIG. 2 is a configuration of an internal voltage generator having a level detector according to an exemplary embodiment of the inventive concept.

FIG. 2 is a configuration of the internal voltage generator 300 including a level detector according to an exemplary embodiment of the inventive concept. The internal voltage generator 300 may include a level detector 101 and an internal voltage driver 201. The level detector 101 may include a reference voltage generator 110, a comparative voltage generator 120, and a sensed voltage generator 130. The sensed voltage generator 130 may include a first resistance unit 131 and a second resistance unit 132. The first resistance unit 131 may include a resistor R1, and the second resistance unit 132 may include a PMOS transistor P2 and a resistor R2.

The reference voltage generator 110 receives a constant voltage and outputs a constant reference voltage Vref. The constant voltage may be configured to always have a constant level.

The comparative voltage generator 120 outputs a comparative voltage Va according to the difference between the reference voltage Vref and a sensed voltage Vfb. For example, the comparative voltage generator 120 may include a differential amplification circuit and output a comparative voltage Va at a low level when the sensed voltage Vfb is lower than the reference voltage Vref and at a high level when the sensed voltage Vfb is higher than the reference voltage Vref.

The sensed voltage generator 130 is connected between an output node A for the internal voltage Vint and a ground voltage. The sensed voltage generator 130 receives the internal voltage Vint and outputs the sensed voltage Vfb that varies with temperature, using a resistance that varies with temperature.

As shown in FIG. 2, the sensed voltage generator 130 may include a first resistance unit 131 and a second resistance unit 132 connected in series between the output node A and the ground voltage. The resistance of the second resistance unit 132 varies with temperature. For example, the first resistance unit 131 may be connected between the output node A for the internal voltage Vint and an intermediate node B for the sensed voltage Vfb, and the second resistance unit 132 may be connected between the intermediate node B for the sensed voltage Vfb and the ground voltage. The second resistance unit 132 may include a PMOS transistor P2 connected to the intermediate node B, and a resistor R2 connected between the PMOS transistor P2 and the ground voltage. The ground voltage is applied to a gate of the PMOS transistor P2. The sensed voltage Vfb (or the internal voltage Vint) may be applied as a bulk bias voltage for the PMOS transistor P2.

The resistance of the second resistance unit 132 varies with temperature. That is, the PMOS transistor P2 serves as a variable resistor having a resistance that decreases when temperature decreases and increases when the temperature increases. Accordingly, the level of the sensed voltage Vfb output from the sensed voltage generator 130 decreases when the temperature decreases and increases when the temperature increases.

The internal voltage driver 201 is connected between the external supply voltage Vext and the output node A for the internal voltage Vint. The internal voltage driver 201, having the external supply voltage Vext as an input, outputs the internal voltage Vint in response to the comparative voltage Va. The internal voltage driver 201 may include a PMOS transistor P1, which adjusts an amount of current flowing from a terminal for the external supply voltage Vext to the output node A for the internal voltage Vint in response to the comparative voltage Va, to output the internal voltage Vint.

Figure 3:
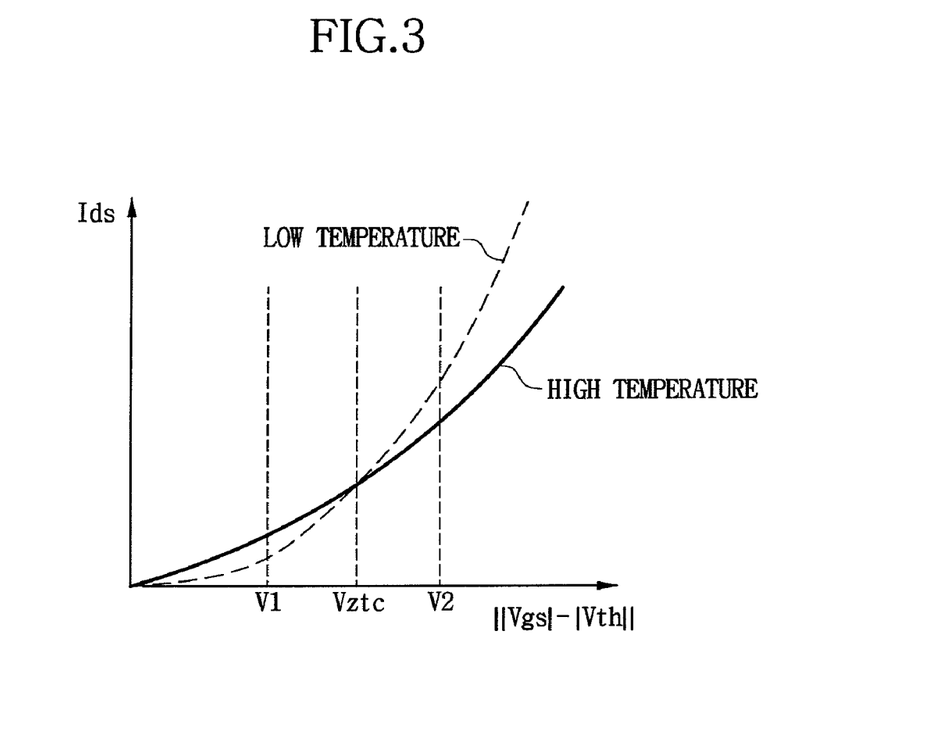
FIG. 3 illustrates a temperature property curve of a transistor for explaining the operation of an internal voltage generator having a level detector according to an exemplary embodiment of the inventive concept.

FIG. 3 illustrates a temperature property curve of a transistor for explaining the operation of the internal voltage generator 300 having a level detector according to an exemplary embodiment of the inventive concept. The dotted line indicates the change of drain-source current Ids of the transistor as a function of the difference between a gate-source voltage Vgs of the transistor and a threshold voltage Vth at low temperature, and the solid line indicates the change of the drain-source current Ids at high temperature.

The operation of the internal voltage generator 300 in FIG. 2 will now be described with reference to FIG. 3.

In FIG. 2, the internal voltage Vint is determined by the following equation:

$$V\text{int} = \left(1 + \frac{R1}{R2 + R(P2)}\right) \times Vref \qquad \text{Equation 1}$$

where R1, R2, and R(P2) denote resistances of the resistor R1, the resistor R2, and the PMOS transistor P2, respectively.

The PMOS transistor P2 is configured to have a high threshold voltage and the gate of the PMOS transistor P2 is connected to the ground voltage, such that the difference between the gate-source voltage of the PMOS transistor P2 and the threshold voltage can become a first voltage V1 that is smaller than a voltage Vztc when a temperature coefficient is 0. That is, a bias point of the PMOS transistor P2 is set to be lower than the voltage Vztc when a temperature coefficient is 0.

As shown in FIG. 3, when the bias point of the PMOS transistor P2 is lower than the voltage Vztc when a temperature coefficient is 0, the drain-source current Ids of the PMOS transistor P2 at low temperature is smaller than that at high temperature. That is, the resistance R(P2) of the PMOS transistor P2 at low temperature is greater than that at high temperature, such that the internal voltage Vint in Equation 1 at low temperature is smaller than that at high temperature.

Figure 4:
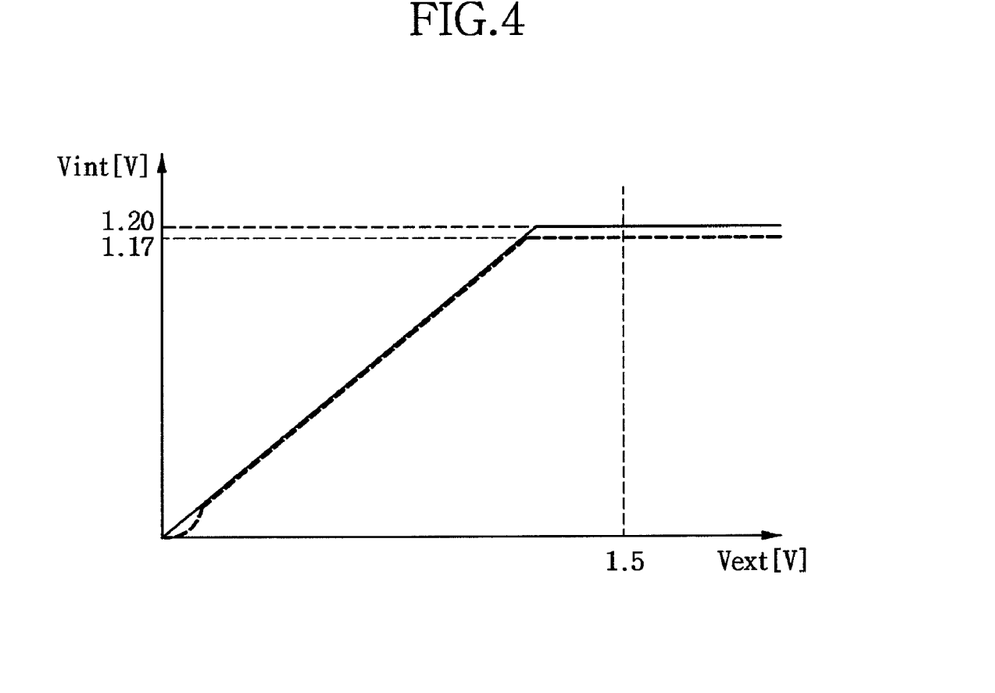
FIG. 4 illustrates a simulation result of the internal voltage generator in FIG. 2.

FIG. 4 illustrates a simulation result of the internal voltage generator 300 in FIG. 2 according to an exemplary embodiment of the inventive concept, i.e., a change of the internal voltage Vint with the external supply voltage Vext. In FIG. 4, the dotted line indicates the change of the internal voltage Vint at low temperature and the solid line indicates the change of the internal voltage Vint at high temperature.

As shown in FIG. 4, the internal voltage generator 300 generates an internal voltage of about 1.2 V at high temperature and a smaller voltage of 1.17 V at low temperature.

Although in FIG. 2, the first resistance unit 131 is connected between the output node A for the internal voltage Vint and the intermediate node B for the sensed voltage Vfb, and the second resistance unit 132 is connected between the intermediate node B and the ground voltage, the second resistance unit 132 may be connected between the output node A and the intermediate node B and the first resistance unit 131 may be connected between the intermediate node B and the ground voltage. In this case, the bias point of the PMOS transistor P2 is set to be lower than the voltage Vztc when a temperature coefficient is 0, such that the internal voltage generation circuit outputs an internal voltage at high temperature at a lower level than that at low temperature.

Figure 5:
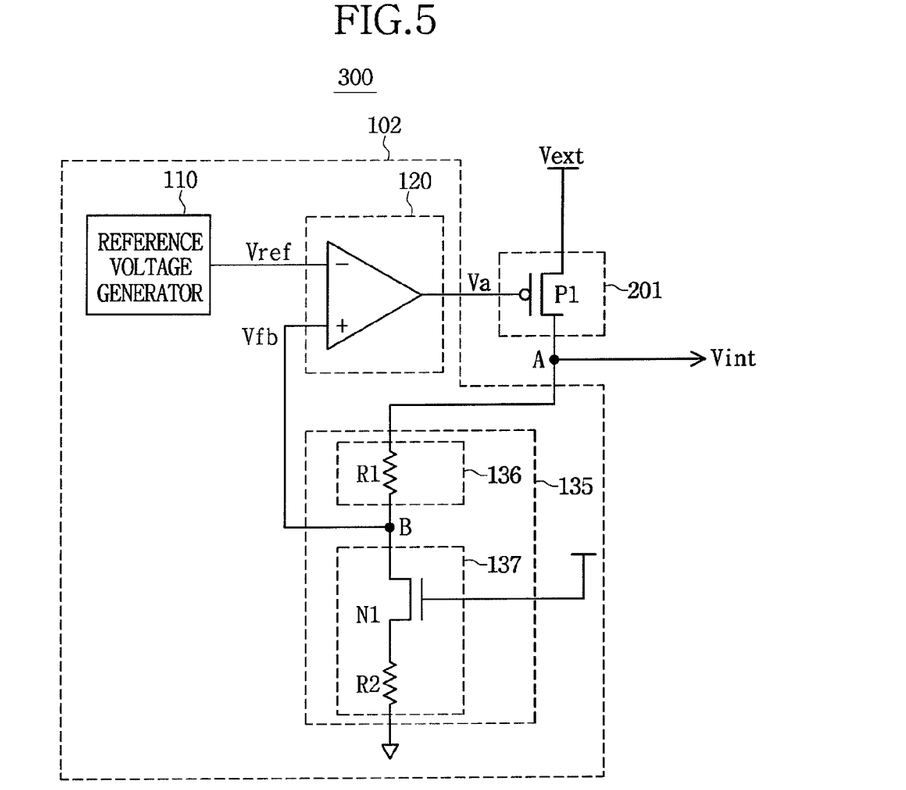
FIG. 5 illustrates an internal voltage generator including a level detector according to an exemplary embodiment of the inventive concept.

FIG. 5 illustrates an internal voltage generator 300 including a level detector according to an exemplary embodiment of the inventive concept. The internal voltage generator may include a level detector 102 and an internal voltage driver 201. The level detector 102 may include a reference voltage generator 110, a comparative voltage generator 120, and a sensed voltage generator 135. Also, the sensed voltage generator 135 may include a first resistance unit 136 and a second resistance unit 137, and the second resistance unit 137 may include an NMOS transistor N1 and a resistor R2.

The functions of the reference voltage generator 110, the comparative voltage generator 120 and the internal voltage driver 201 of FIG. 5 are the same as those in FIG. 2.

The sensed voltage generator 135 is connected between an output node A for an internal voltage Vint and a ground voltage. The sensed voltage generator 135 receives the internal voltage Vint and outputs a sensed voltage Vfb that varies with temperature, using a resistance that varies with temperature.

As shown in FIG. 5, the sensed voltage generator 135 may include a first resistance unit 136 and a second resistance unit 137 connected in series between the output node A for the internal voltage Vint and the ground voltage, and the resistance of the second resistance unit 137 varies with temperature. The second resistance unit 137 may include the NMOS transistor N1 connected to the intermediate node B for the sensed voltage Vfb and the resistor R2 connected between the NMOS transistor N1 and the ground voltage. The internal voltage Vint (or an external supply voltage Vext) may be applied to a gate of the NMOS transistor N1.

The resistance of the second resistance unit 137 varies with temperature. That is, the NMOS transistor N1 serves as a variable resistor having a resistance that increases when temperature decreases and decreases when the temperature increases. Accordingly, a level of the sensed voltage Vfb output from the sensed voltage generator 135 increases when temperature decreases and decreases when the temperature increases.

The operation of the internal voltage generation circuit for a semiconductor device according to the exemplary embodiment of the inventive concept depicted in FIG. 5 will now be described with reference to FIG. 3.

In FIG. 5, the internal voltage Vint is determined by the following equation:

$$V\text{int} = \left(1 + \frac{R1}{R2 + R(N1)} \times Vref\right) \quad \text{Equation 2}$$

where R1, R2, and R(N1) denote resistances of the resistor R1, the resistor R2, and the NMOS transistor N1, respectively.

The NMOS transistor N1 is configured to have a low threshold voltage and the gate of the NMOS transistor N1 is connected to the external voltage, such that the difference between the gate-source voltage of the NMOS transistor N1 and the threshold voltage can become a second voltage V2 that is greater than a voltage Vztc when a temperature coefficient is 0. That is, a bias point of the NMOS transistor N1 is set to be higher than the voltage Vztc when a temperature coefficient is 0.

As shown in FIG. 3, when the bias point of the NMOS transistor N1 is higher than the voltage Vztc when a temperature coefficient is 0, the drain-source current Ids of the NMOS transistor N1 at low temperature is greater than that at high temperature. That is, the resistance of the NMOS transistor N1 at low temperature is smaller than that at high temperature, such that the internal voltage Vint at low temperature is greater than that at high temperature.

Figure 6:
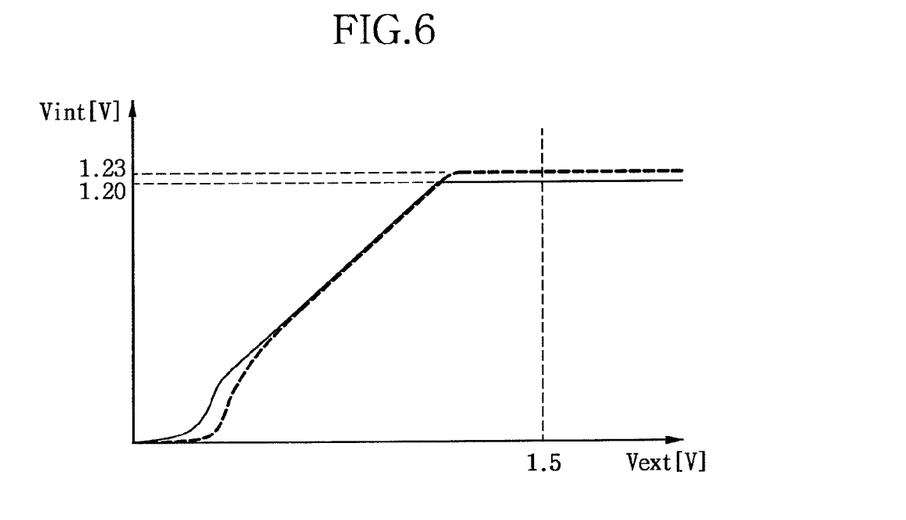
FIG. 6 illustrates a simulation result of the internal voltage generator in FIG. 5.

FIG. 6 illustrates a simulation result of the internal voltage generator 300 in FIG. 5 according to an exemplary embodiment of the inventive concept, i.e., a change of the internal voltage Vint with the external supply voltage Vext. In FIG. 6, the dotted line indicates the change of the internal voltage Vint at low temperature and the solid line indicates the change of the internal voltage Vint at high temperature.

As shown in FIG. 6, the internal voltage generator in accordance with the exemplary embodiment of the inventive concept generates an internal voltage of about 1.2 V at high temperature and a greater voltage of 1.23 V at low temperature.

Although in FIG. 5, the first resistance unit 136 is connected between the output node A and the intermediate node B and the second resistance unit 137 is connected between the intermediate node B and the ground voltage, the second resistance unit 137 may be connected between the output node A and the intermediate node B and the first resistance unit 136 may be connected between the intermediate node B and the ground voltage. In this case, the bias point of the NMOS transistor N1 is set to be higher than the voltage Vztc when a temperature coefficient is 0, such that the internal voltage generation circuit outputs an internal voltage at high temperature at a higher level than that at low temperature.

Figure 7:
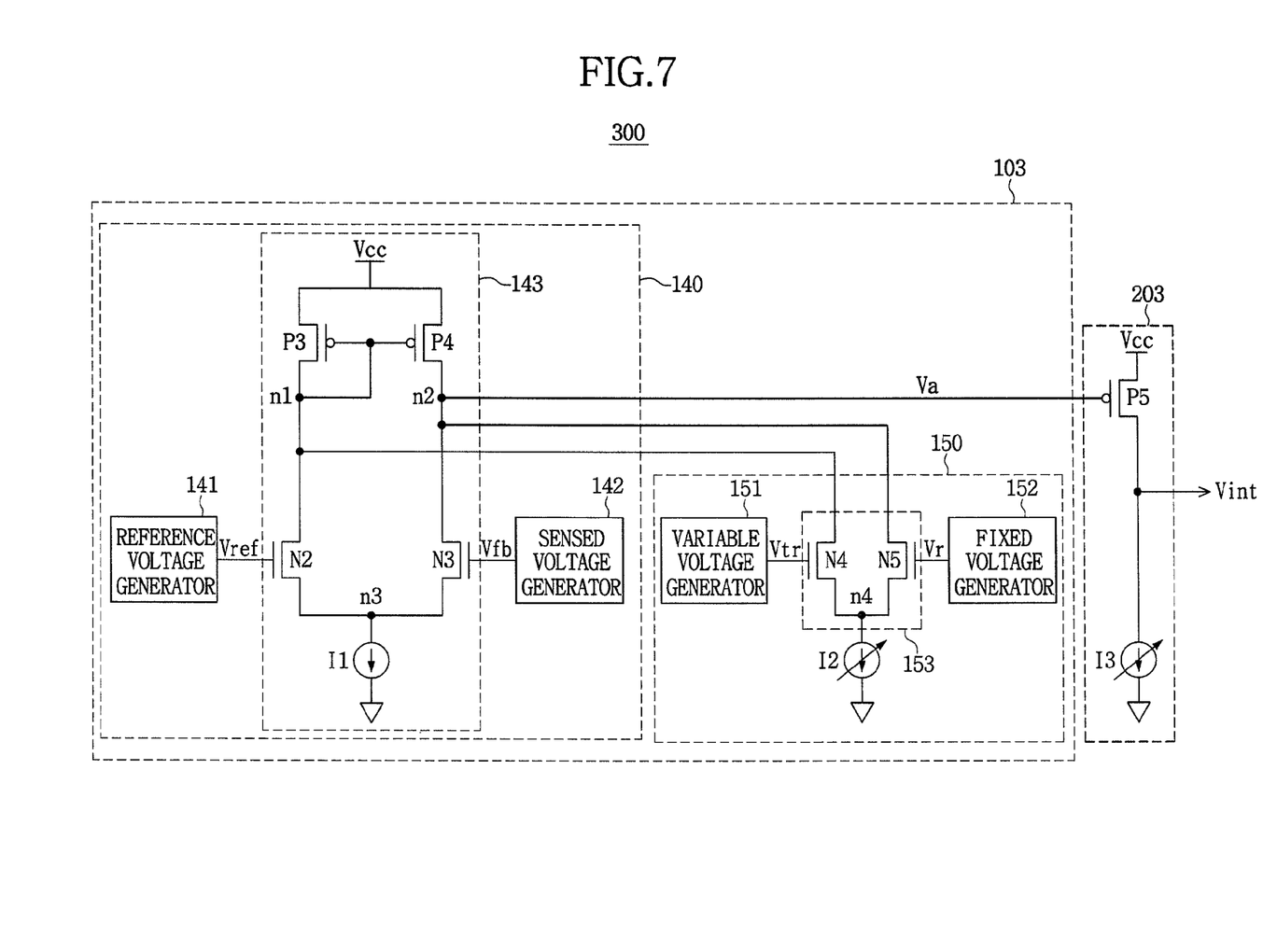
FIG. 7 illustrates a configuration of an internal voltage generator having a level detector according to an exemplary embodiment of the inventive concept.

FIG. 7 illustrates a configuration of an internal voltage generator 300 including a level detector according to an exemplary embodiment of the inventive concept. The internal voltage generator 300 may include a level detector 103 and an internal voltage driver 203. The level detector 103 may include a differential amplifying unit 140 and a temperature coefficient adjustment unit 150. The differential amplifying unit 140 may include a reference voltage generator 141, a sensed voltage generator 142, and a differential amplifier 143. The differential amplifier 143 may include PMOS transistors P3, P4, NMOS transistors N2, N3, and a first current source I1. The temperature coefficient adjustment unit 150 may include a variable voltage generator 151, a fixed voltage generator 152, a current controller 153, and a second current source I2. The current controller 153 may include NMOS transistors N4, N5. The internal voltage driver 203 may include a PMOS transistor P5 and a third current source I3. The first current source I1 may be a constant current source, and the second and third current sources I2, I3 may be variable current sources.

The differential amplifier 143 including PMOS transistors P3, P4, NMOS transistors N2, N3, and the first current source I1 serves as a current mirror differential amplifier. The PMOS transistor P3 is connected between a supply voltage Vcc and a node n1, and has a gate to which a voltage at the node n1 is applied. The PMOS transistor P4 is connected between the supply voltage Vcc and a node n2, and has a gate to which a voltage at the node n1 is applied. The NMOS transistor N2 is connected between the node n1 and a node n3 and has a gate to which a reference voltage Vref is applied. The NMOS transistor N3 is connected between the node n2 and the node n3 and has a gate to which a sensed voltage Vfb is applied. The first current source I1 is connected between the node n3 and a ground voltage.

The NMOS transistor N4 of the temperature coefficient adjustment unit 150 is connected between the node n1 and a node n4 and has a gate to which a variable voltage Vtr is applied. The NMOS transistor N5 is connected between the node n2 and the node n4 and has a gate to which a fixed voltage Vr is applied. The second current source I2 is connected between the node n4 and the ground voltage.

The PMOS transistor P5 of the internal voltage driver 203 is connected between the supply voltage Vcc and an output node for an internal voltage Vint and has a gate to which a voltage at the node n2 is applied. The third current source I3 is connected between the output node for the internal voltage Vint and the ground voltage.

The differential amplifying unit 140 compares the reference voltage Vref with the sensed voltage Vfb and outputs a differentially amplified comparative voltage Va on the second node n2 in response to the voltage at the first node n1 varying according to a result of the comparison. As described above, the PMOS transistors P3, P4, the NMOS transistors N2, N3, and the current source I1 serve as a current mirror differential amplifier, which is driven by the current source I1, changes the voltage at the second node n2 in response to the voltage at the first node n1 varying a difference between the reference voltage Vref and the sensed voltage Vfb, and outputs the voltage at the second node n2 as the comparative voltage Va. That is, when the level of the sensed voltage Vfb decreases, the current flowing from the second node n2 to the third node n3 decreases, such that current flowing from the first node n1 to the third node n3 increases and the voltage at the first node n1 decreases. When the voltage at the first node n1 decreases, current flowing through the PMOS transistors P3, P4 increases, such that the voltage at the second node n2, i.e., the comparative voltage Va, increases. When the level of the sensed voltage Vfb increases, the current flowing from the second node n2 to the third node n3 increases, such that the current flowing from the first node n1 to the third node n3 decreases and the voltage at the first node n1 increases. When the voltage at the first node n1 increases, the current flowing through the PMOS transistors P3, P4 decreases, such that the voltage at the second node n2, i.e., the comparative voltage Va, decreases.

The current source I1 driving the differential amplifier 143 may be a constant current source to obtain a constant operational speed of the level detector.

The reference voltage generator 141 receives a constant voltage and outputs a constant reference voltage Vref. The constant voltage may always have a constant level. The sensed voltage generator 142 outputs the sensed voltage Vfb in response to the internal voltage Vint. The levels of the reference voltage Vref and the sensed voltage Vfb output from the reference voltage generator 141 and the sensed voltage generator 142 may not be affected by temperature.

The temperature coefficient adjustment unit 150 is driven by the second current source I2, and changes current flowing through the first node n1 and the second node n2 in response to the variable voltage Vtr that varies with temperature and the fixed voltage Vr having a predetermined level that does not vary with the temperature. That is, when the variable voltage Vtr increases, current flowing from the first node n1 to the fourth node n4 increases and current flowing from the second node n2 to the fourth node n4 decreases. Since the current flowing from the first node n1 to the fourth node n4 increases, the voltage at the first node n1 decreases, such that the current flowing through the PMOS transistors P3, P4 increases and the voltage at the second node n2 increases. When the variable voltage Vtr decreases, the current flowing from the first node n1 to the fourth node n4 decreases and the current flowing from the second node n2 to the fourth node n4 increases. Since the current flowing from the first node n1 to the fourth node n4 decreases, the voltage at the first node n1 increases, such that the current flowing through the PMOS transistors P3, P4 decreases and the voltage at the second node n2 decreases.

Also, the second current source I2 in the temperature coefficient adjustment unit 150 may be a variable current source to adjust a change amount of the threshold voltage according to the temperature.

The variable voltage generator 151 outputs a variable voltage Vtr that varies with temperature and the fixed voltage generator 152 outputs a fixed voltage Vr having a predetermined level that does not vary with temperature.

The internal voltage driver 203 outputs the internal voltage Vint in response to the comparative voltage Va. That is, the internal voltage driver 203 may be configured to output the internal voltage Vint that decreases when the comparative voltage Va increases and that increases when the comparative voltage Va decreases.

The third current source I3 of the internal voltage driver 203 may be a variable current source to eliminate a change of an offset with a change of current from the first and second current sources I1, I2. For example, it is assumed that the first current source I1 is a constant current source and the second current source I2 is a variable current source. When current from the second current source I2 increases, the voltage at the second node n2, i.e., the comparative voltage Va, decreases and the internal voltage Vint increases. Also, when the current from the second current source I2 decreases, the voltage at the second node n2, i.e., the comparative voltage Va, increases and the internal voltage Vint decreases. The current from the third current source I3 may be adjusted to increase when the current from the second current source I2 increases and the current from the third current source I3 may be adjusted to decrease when the current from the second current source I2 decreases, to offset the change of the internal voltage Vint with the change of the current from the second current source I2. In such an exemplary embodiment the sensed voltage would not vary with temperature.

The sensed voltage generator 142 may be configured to receive an input voltage other than the internal voltage Vint. In this case, the voltage driven by the internal voltage driver 203 may be an output voltage indicating the level of the input voltage rather than the internal voltage Vint. Also, the internal voltage generator may further include a buffer (not shown) for receiving the output voltage and outputting a high level signal when the level of the output voltage is higher than a predetermined voltage level and a low level signal when the level of the output voltage is lower than the predetermined voltage level.

Although in FIG. 7 the voltage at the first node n1 is applied to the PMOS transistors P3, P4 of the differential amplifying unit 140 and the voltage at the second node n2 is output as the comparative voltage Va, the differential amplifying unit 140 in the level detector of the inventive concept 103 may be configured such that the voltage at the second node n2 is applied to the PMOS transistors P3, P4 and the voltage at the first node n1 is output as the comparative voltage Va.

Figure 8:
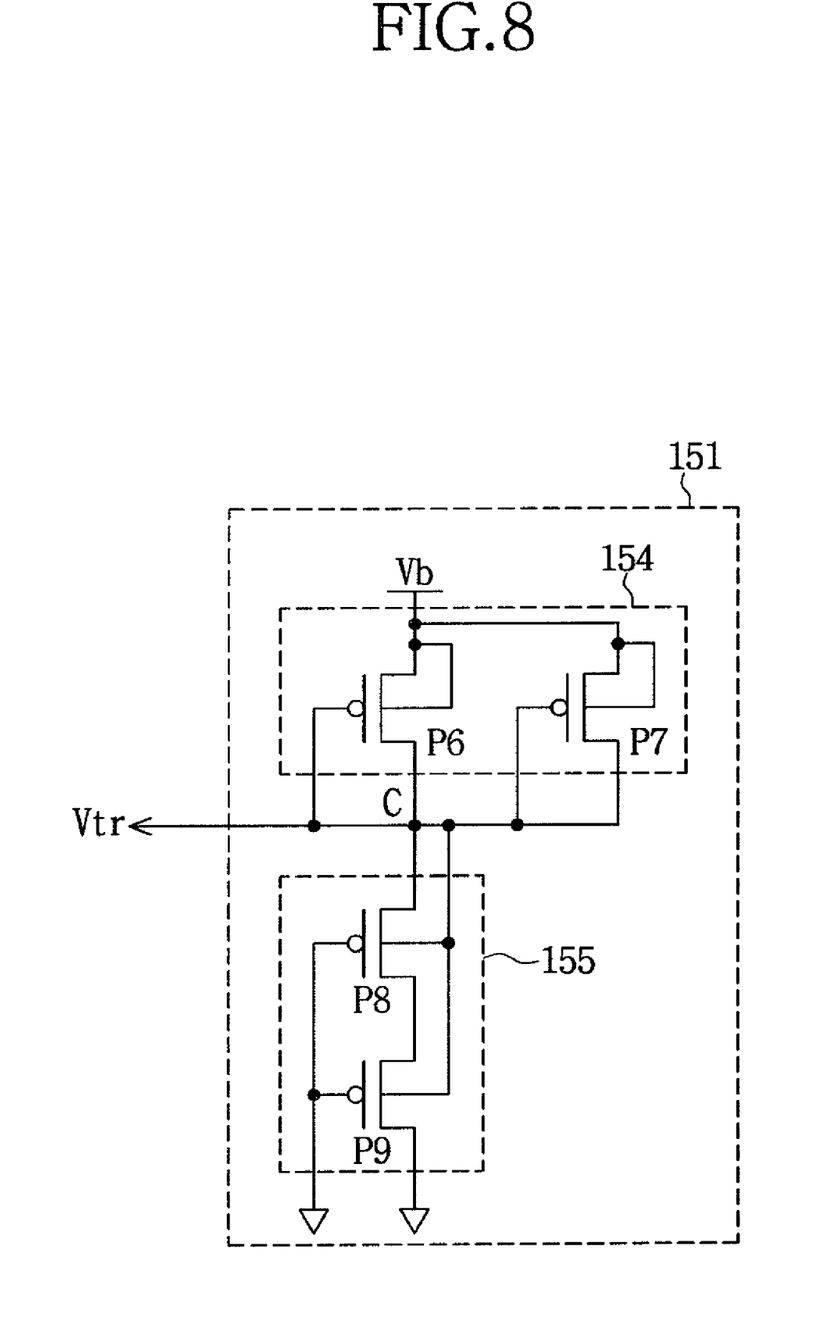
FIG. 8 illustrates a configuration of a variable voltage generator of a temperature coefficient adjustment unit in the level detector of the internal voltage generator in FIG. 7 according to an exemplary embodiment of the inventive concept.

FIG. 8 illustrates a configuration of the variable voltage generator 151 of the temperature coefficient adjustment unit 150 in the level detector 103 of the internal voltage generator in FIG. 7 according to an exemplary embodiment of the inventive concept. The variable voltage generator 151 may include a first variable resistance unit 154 and a second variable resistance unit 155. The first variable resistance unit 154 may include transistors P6, P7 connected in parallel between a constant voltage Vb and the node C, and the second variable resistance unit 155 may include transistors P8, P9 connected in series between the node C and a ground voltage. The first variable resistance unit 154 may be configured such that the variable voltage Vtr is applied to gates of the transistors P6, P7 and the constant voltage Vb is applied as a substrate voltage for the transistors P6, P7. The second variable resistance unit 155 may be configured such that the ground voltage is applied to gates of the transistors P8, P9 and the variable voltage Vtr is applied as a substrate voltage for the transistors P8, P9. Also, the transistors P6, P7 and the transistors P8, P9 in the first variable resistance unit 154 and the second variable resistance unit 155 may be configured as PMOS transistors. Although the first and second variable resistance units 154, 155 may include two transistors in FIG. 8, respectively, the number of the transistors may vary.

The resistances of the first variable resistance unit 154 and the second variable resistance unit 155 vary with temperature. For example, the first variable resistance unit 154 may be configured to have a resistance that decreases as the temperature increases and increases as the temperature decreases, and the second variable resistance unit 155 may be configured to have resistance that increases as the temperature increases and decreases as the temperature decreases.

As shown in FIG. 8, the first variable resistance unit 154 and the second variable resistance unit 155 may include the same type of transistors. In this case, the transistors in the first variable resistance unit 154 may be connected in parallel, and the transistors in the second variable resistance unit 155 may be connected in series. Although not shown, the transistors in the first variable resistance unit 154 may be configured to have a relatively large width and a relatively small length, and the transistors in the second variable resistance unit 155 may be configured to have a relatively small width and a relatively large length.

Figure 9:
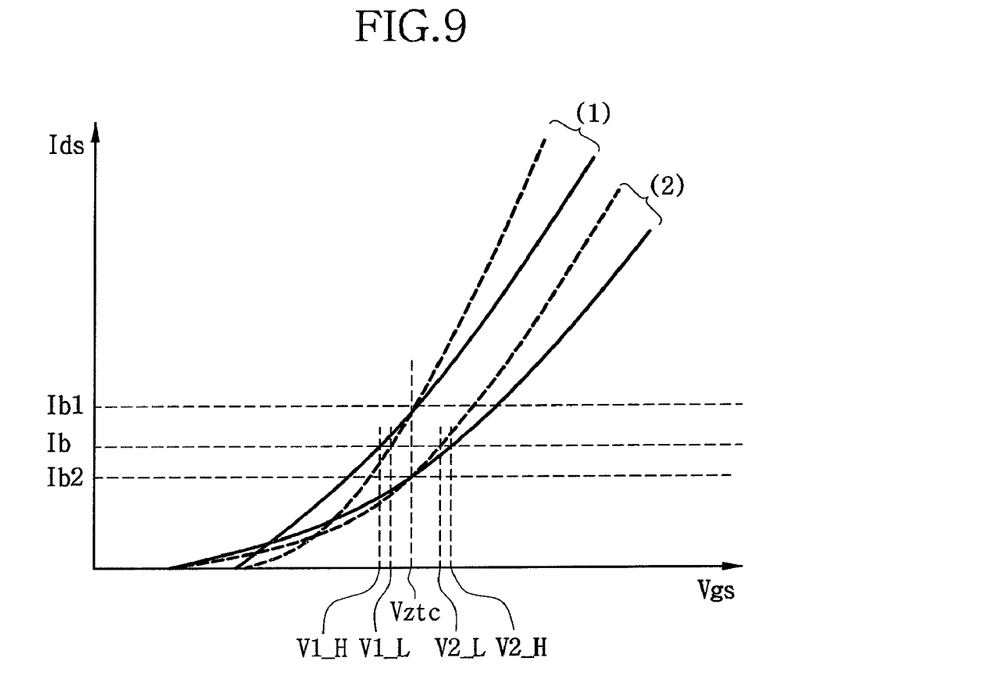
FIG. 9 illustrates a property curve between a gate-source voltage and a drain-source current of a transistor according to temperature for explaining the operation of the variable voltage generator of the temperature coefficient adjustment unit in the level detector in FIG. 8.

FIG. 9 illustrates a temperature property curve of a transistor for explaining the operation of the variable voltage generator 151 in the level detector 103 in FIG. 8 according to an exemplary embodiment of the inventive concept. In FIG. 9, (1) indicates the change of drain-source current Ids with a gate-source voltage Vgs of the transistor in the first variable resistance unit 154, and (2) indicates the change of drain-source current Ids with a gate-source voltage Vgs of the transistor in the second variable resistance unit 155. In FIG. 9, the dotted line indicates the change of drain-source current Ids with a gate-source voltage Vgs of the transistor at low temperature, and the solid line indicates the change of drain-source current Ids with a gate-source voltage Vgs of the transistor at high temperature.

The operation of the variable voltage generator 151 of the level detector 103 in FIG. 8 will now be described with reference to FIG. 9.

The variable voltage generator 151 consists of transistors whose the voltage Vztc (in which transistor's temperature coefficient is 0) is about Vb/2. In other words, the temperature coefficient of the transistors of the variable voltage generator 151 is 0 when the gate-source voltage Vgs of the transistors is about Vb/2.

When the first variable resistance unit 154 includes the transistors connected in parallel and the second variable resistance unit 155 includes the transistors connected in series, as shown in FIG. 8, bias current Ib flowing through the first variable resistance unit 154 and the second variable resistance unit 155 in the variable voltage generator 151 has a value between the first bias current Ib1 and the second bias current Ib2, as shown in FIG. 9. Here, a first bias current Ib1 indicates bias current flowing when the gate-source voltage Vgs is the voltage Vztc in the first variable resistance unit 154, and a second bias current Ib2 indicates bias current flowing when the gate-source voltage Vgs is the voltage Vztc in the second variable resistance unit 155.

Since the first variable resistance unit 154 and the second variable resistance unit 155 are connected in series between the constant voltage Vb and the ground voltage as shown in FIG. 8, the same bias current Ib flows through the first variable resistance unit 154 and the second variable resistance unit 155.

Referring to FIG. 9, in the first variable resistance unit 154, when temperature increases, the gate-source voltage of the transistor, i.e., a voltage across the first variable resistance unit 154, increases, and when the temperature decreases, the voltage across the first variable resistance unit 154 decreases. That is, the resistance of the first variable resistance unit 154 increases when the temperature increases and decreases when the temperature decreases. In the second variable resistance unit 155, when temperature increases, the gate-source voltage of the transistor, i.e., a voltage across the second variable resistance unit 155, increases, and when the temperature decreases, the voltage across the second variable resistance unit 155 decreases. That is, the resistance of the second variable resistance unit 155 increases when temperature increases and decreases when temperature decreases. Accordingly, the voltage at the node C, i.e., the variable voltage Vtr, increases when the temperature increases and decreases when temperature decreases.

Figure 10:
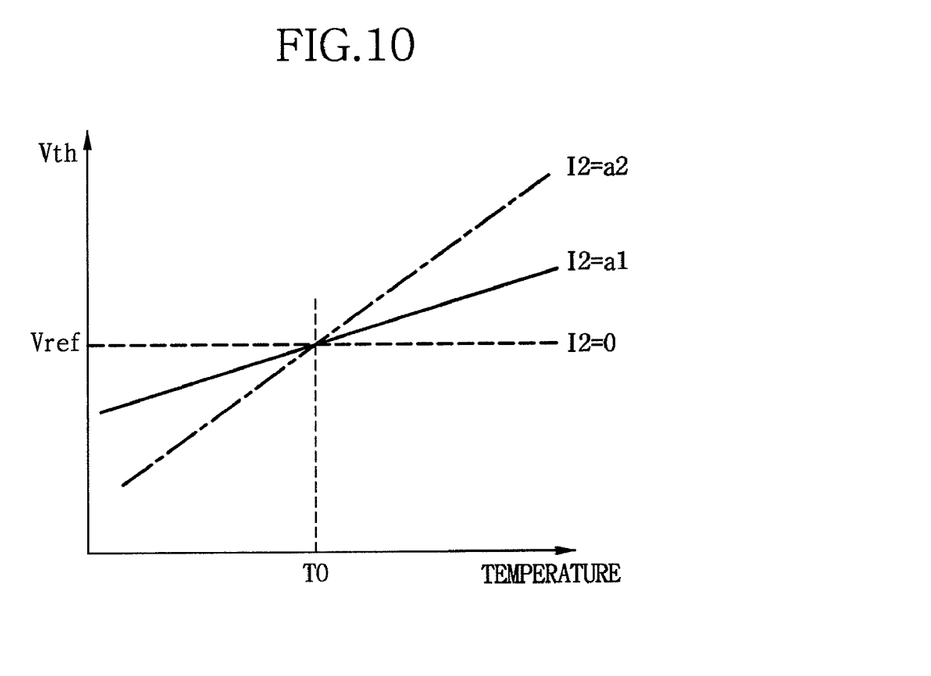
FIG. 10 is a diagram for explaining the operation of a level detector in FIGS. 7 and 8.

FIG. 10 illustrates a graph showing the change of the threshold voltage with temperature as a function of the amount of the current generated by the second current source I2. The dotted line indicates the case in which the current generated by the second current source I2 has the amount of 0. The solid line indicates the case in which the current generated by the second current source I2 has the amount of a1. The dashed dotted line indicates the case in which the current generated by the second current source I2 has the amount of a2 greater than a1.

The operation of the level detector 103 will now be described with reference to FIGS. 7 to 10.

The level detector 103 may be configured to output the comparative voltage Va that decreases when the sensed voltage Vfb is higher than a predetermined threshold voltage and that increases when the sensed voltage Vfb is lower than the predetermined threshold voltage. As a result, the internal voltage generator according to the exemplary embodiment of the inventive concept may be configured to increase the internal voltage Vint when the sensed voltage Vfb is higher than the predetermined threshold voltage and to decrease the internal voltage Vint when the sensed voltage Vfb is lower than the threshold voltage.

If the internal voltage generator further includes a buffer for outputting an output signal and the sensed voltage generator 142 of the level detector 103 generates the sensed voltage Vfb in response to an input voltage other than the internal voltage Vint as described above, the level detector outputs an output signal at a high level when the sensed voltage Vfb is higher than the threshold voltage and at a low level when the sensed voltage Vfb is lower than the threshold voltage.

When the variable voltage Vtr increases, current flowing from the first node n1 to the fourth node n4 increases. This yields the same effect as that obtained by the increased reference voltage Vref, i.e, an increased threshold voltage of the level detector 103. That is, when the variable voltage Vtr increases, the level of the internal voltage Vint decreases or when the sensed voltage Vtb moves to a relatively higher level, the output signal level varies.

Also, a decrease in the variable voltage Vtr yields the same effect as that obtained by the decreased reference voltage Vref, similar to the foregoing. Accordingly, this leads to the decreased threshold voltage of the level detector 103. That is, when the variable voltage Vtr decreases, the level of the internal voltage Vint increases or when the sensed voltage Vfb moves to a relatively lower level, the output signal level varies.

That is, for the level detector 103 and the internal voltage generator including the level detector 103 in FIGS. 7 and 8, if current from the second current source I2 is nonzero, the variable voltage Vtr increases and the threshold voltage of the level detector increases when temperature increases, and the threshold voltage of the level detector decreases when the temperature decreases. The threshold voltage of the level detector of the inventive concept 103 in FIGS. 7 and 8 may be represented using the following equation:

$$Vth = Vref + (Vtr - Vr)\sqrt{\beta \frac{I2}{I1}}$$

where Vth denotes the threshold voltage, Vtr denotes the variable voltage, Vr denotes the fixed voltage, β denotes a ratio of a current gain of the NMOS transistors N4, N5 in the current controller 153 of the temperature coefficient adjustment unit 150 to a current gain of the NMOS transistors N2, N3 in the differential amplifier 143, I2 denotes the current generated by the second current source I2, I1 denotes the current generated by the first current source I1.

Although in FIGS. 7 and 8, the variable voltage generator 151 controls the current flowing through the first node n1, on which current is controlled by the reference voltage generator 141, and the fixed voltage generator 152 controls the current flowing through the second node n2, on which current is controlled by the sensed voltage generator 142, the level detector 103 may be configured such that the variable voltage generator 151 controls the current flowing through the second node n2 on which the current is controlled by the sensed voltage generator 142 and the fixed voltage generator 152 controls the current flowing through the second node n2 on which current is controlled by the reference voltage generator 141. In this case, the threshold voltage of the level detector 103 decreases when the temperature increases and increases when the temperature decreases.

Although the transistors in the first variable resistance unit 154 are connected in parallel and the transistors in the second variable resistance unit 155 are connected in series in FIG. 8, the variable voltage generator 151 of the level detector 103 may be configured such that the transistors in the first variable resistance unit 154 are connected in series and the transistors in the second variable resistance unit 155 are connected in parallel. In this case, the variable voltage Vtr decreases when the temperature increases and increases when the temperature decreases.

That is, the level detector can change the threshold voltage with temperature without changing the reference voltage Vref.

Figure 11A:
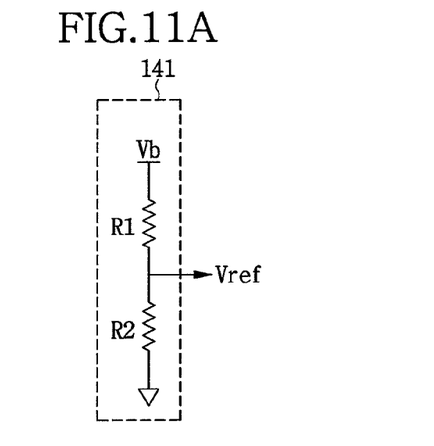
FIGS. 11A, 11B and 11C illustrate configurations of a reference voltage generator, a sensed voltage generator, and a fixed voltage generator of the level detector in FIG. 7.
Figure 11B:
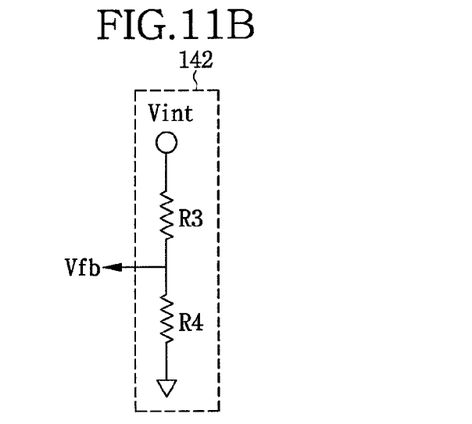
Figure 11C:
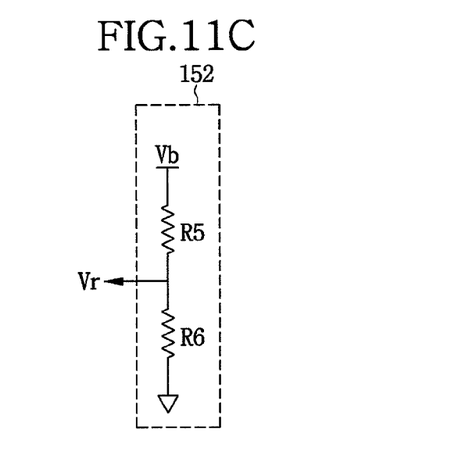

FIGS. 11A, 11B and 11C respectively illustrate configurations of the reference voltage generator 141, the sensed voltage generator 142, and the fixed voltage generator 152 of the level detector 103 in FIG. 7. Each of the reference voltage generator 141, the sensed voltage generator 142, and the fixed voltage generator 152 may include resistors connected in series.

That is, the reference voltage generator 141 may include two resistors R1, R2 connected in series between the constant voltage Vb and a ground voltage. The reference voltage generator 141 receives the constant voltage Vb and outputs a reference voltage Vref having a constant level. The constant voltage Vb may be the same voltage as the supply voltage Vcc, or a voltage having a constant level generated using the supply voltage Vcc.

The sensed voltage generator 142 may include two resistors R3, R4 connected in series between an input terminal for an internal voltage Vint (or an input voltage other than the internal voltage Vint) and the ground voltage. The sensed voltage generator 142 outputs the sensed voltage Vfb in proportion to the internal voltage Vint (or the other input voltage) in response to the internal voltage Vint (or the other input voltage).

The fixed voltage generator 152 may include two resistors R5, R6 connected in series between the constant voltage Vb and the ground voltage. The fixed voltage generator 152 receives the constant voltage Vb and outputs a fixed voltage Vr having a constant level. The level of the fixed voltage Vr may be adjusted by changing resistances of the resistors R5, R6. For example, the level of the fixed voltage Vr may be set as the same level as the level of the variable voltage Vtr at a temperature at which the level of the threshold voltage of the level detector of the exemplary embodiment is desired to be the same as the level of the reference voltage Vref.

Figure 12:
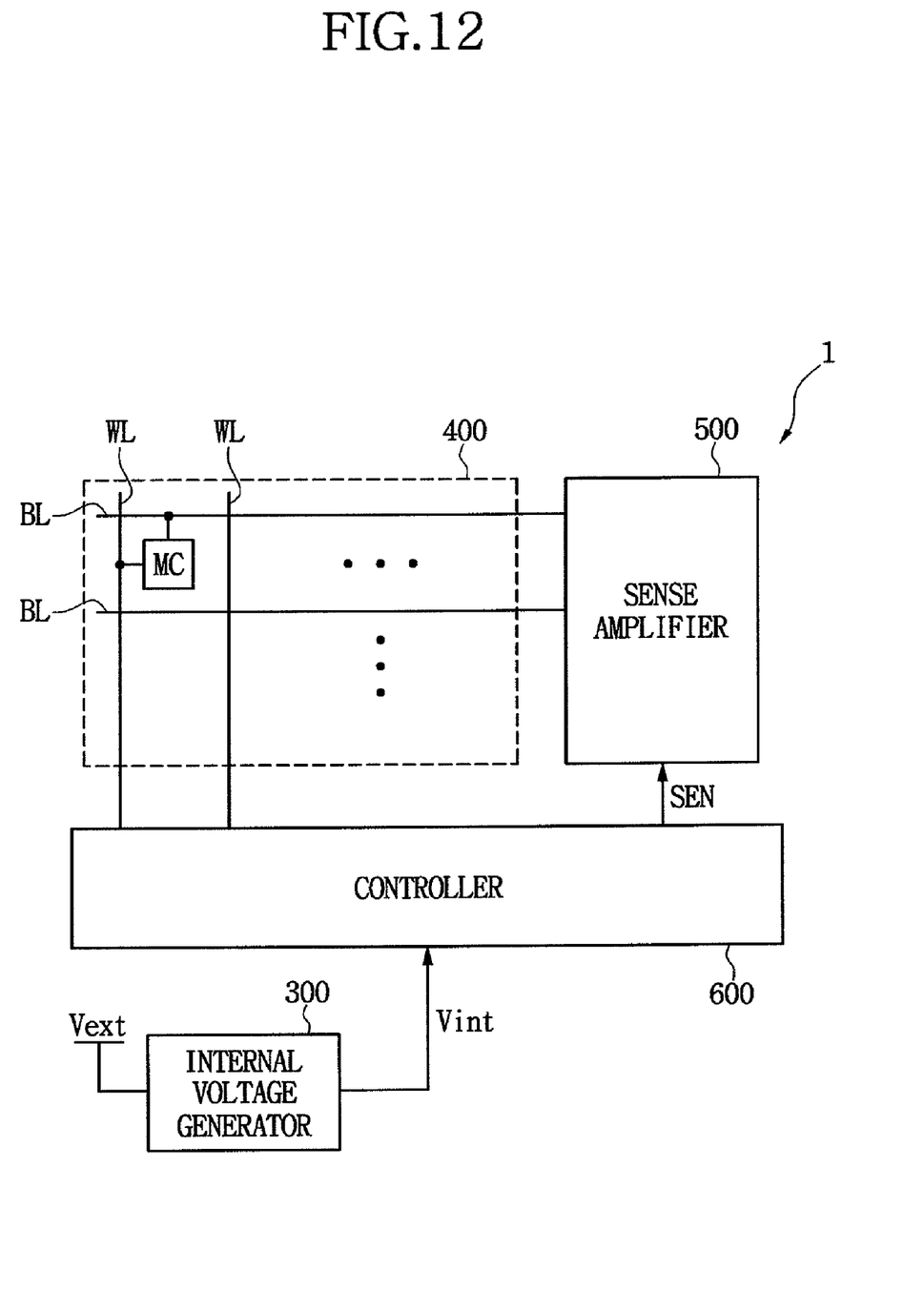
FIG. 12 is a block diagram of a semiconductor memory device including the internal voltage generator according to an exemplary embodiment of the inventive concept.

FIG. 12 is a block diagram of a semiconductor memory device 1 including the internal voltage generator 300 according to an exemplary embodiment of the inventive concept. The semiconductor memory device 1 may include the internal voltage generator 300, a memory cell array 400, a sense amplifier 500, and a controller 600.

The memory cell array 400 may include a plurality of memory cells MC connected between a plurality of word lines WL and a plurality of bit lines BL, in which data is written or read to or from the memory cells MC.

In response to a sense enable signal SEN, the sense amplifier 500 senses and amplifies a signal on a corresponding bit line of the bit lines BL.

The internal voltage generator 300 may have the same configuration as in FIGS. 2, 5, and/or 7. The internal voltage generator 300 receives an external supply voltage Vext and outputs an internal voltage Vint that varies with temperature.

The controller 600 receives the internal voltage Vint, drives a corresponding word line of the plurality of word lines WL in response to an external command, and outputs the sense enable signal SEN to the sense amplifier 500.

Although not shown, the controller 600 may include a word line driver for driving the word lines using the internal voltage Vint from the internal voltage generator 300 in response to the external command, and/or a delay circuit for receiving the internal voltage Vint from the internal voltage generator 300 and obtaining a delay time until the sense amplifier enable signal SEN is activated after the word line is driven. The internal voltage generator 300 that outputs the internal voltage Vint to the word line driver (not shown) may be configured to generate a higher internal voltage at low temperature (e.g., like the internal voltage generator in FIG. 5). The internal voltage generator 300 that outputs the internal voltage Vint to the delay circuit (not shown) may be configured to generate a higher internal voltage at high temperature.

In a read operation in the semiconductor memory device 1, a predetermined delay time is required until the sense enable signal is activated after the word line is enabled to obtain a sensing margin between bit lines. The delay circuit may be used to obtain such delay time. However, since the mobility of carriers of transistors in the delay circuit is reduced at high temperature, the delay time at high temperature becomes longer than that at low temperature. Accordingly, when a semiconductor memory device is configured to obtain the delay time for high temperature, it is difficult to obtain the sensing margin at low temperature, such that the semiconductor memory device 1 may malfunction. In this case, when the internal voltage Vint output from the internal voltage generator 300 that generates a lower internal voltage Vint at low temperature (e.g., the internal voltage generator 300 of the inventive concept in FIG. 2 or 7) is supplied as a supply voltage for the delay circuit, the delay time becomes longer as the supply voltage for the delay circuit decreases at low temperature, such that the sensing margin can be obtained to prevent malfunction of the semiconductor memory device.

Although not shown, the memory cell MC may include a cell transistor having a gate connected to the word line, and a cell capacitor connected to the cell transistor. However, the threshold voltage of the transistor at low temperature becomes higher than that at high temperature, which may cause malfunction of the semiconductor memory device. In this case, when the word line is driven using the internal voltage Vint output from the internal voltage generator 300 that generates a higher internal voltage Vint at low temperature (e.g., the internal voltage generator 300 in FIG. 5), a higher voltage can be supplied to the word line at low temperature, thereby compensating for the increased threshold voltage. As a result, a malfunction of the semiconductor memory device can be prevented.

Thus, the level detector of at least one of the exemplary embodiments of the inventive concept can change a threshold voltage with temperature without changing a reference voltage, and an internal voltage generator can generate an internal voltage that varies with temperature. Also, a semiconductor memory device in accordance with at least one exemplary embodiment of the inventive concept employs the internal voltage that varies with temperature for high reliability.

Although in the above-described exemplary embodiments, the level detector in accordance with the inventive concept and the internal voltage generator including the level detector are applied to a semiconductor memory device, they can also be applied to semiconductor devices other than the semiconductor memory device.

The foregoing is illustrative of exemplary embodiments and is not to be construed as limiting thereof. Although practical exemplary embodiments have been described, those skilled in the art will readily appreciate that many modifications are possible to the exemplary embodiments without materially departing from the present inventive concept. Therefore, the foregoing exemplary embodiments, any modifications to the exemplary embodiments, as well as other embodiments, are intended to be included within the scope of the appended claims.

What is claimed is:

1. A level detector, comprising:
a differential amplifying unit configured to output a differentially amplified comparative voltage at a second node in response to a voltage at a first node that varies based upon a difference between a reference voltage and a sensed voltage; and
a temperature coefficient adjustment unit configured to control current that flows through the first node in response to a variable voltage having a level that varies with temperature, and to control current that flows through the second node in response to a fixed voltage having a level that does not vary with temperature,
wherein the differential amplifying unit comprises:
a reference voltage generator configured to receive an external constant voltage and to output the reference voltage;
a sensed voltage generator configured to output the sensed voltage in response to an input voltage; and
a differential amplifier that is driven by a first current source and configured to output a voltage at the second node that varies based upon the voltage at the first node, as the differentially amplified comparative voltage,
wherein the reference voltage and the sensed voltage do not vary with temperature.

2. The level detector of claim 1, wherein the temperature coefficient adjustment unit comprises:
a variable voltage generator configured to receive the constant voltage and to output the variable voltage that varies with temperature;
a fixed voltage generator configured to receive the constant voltage and to output the fixed voltage;
a current controller connected between the first node and the second node and a third node, and configured to control current that flows from the first node to the third node in response to the variable voltage, and to control current that flows from the second node to the third node in response to the fixed voltage; and
a second current source connected between the third node and a ground voltage for driving the current controller.

3. The level detector of claim 2, wherein the variable voltage generator comprises:
a first variable resistance unit connected between the constant voltage and an output node for the variable voltage and having a resistance that varies with temperature; and
a second variable resistance unit connected between the output node for the variable voltage and the ground voltage and having a resistance that varies with temperature.

4. The level detector of claim 3, further comprising an output unit including a PMOS transistor connected between the supply voltage and an output terminal for an output signal and having a gate to which the differentially amplified comparative voltage is applied, and a third current source connected between the output terminal for the output signal and the ground voltage,
wherein the first current source is a constant current source, and the second current source and the third current source are variable current sources, and
wherein the third current source increases current that flows from the output terminal for the output signal to the ground voltage when current generated by the second current source increases and decreases current that flows from the output terminal for the output signal to the ground voltage when the current generated by the second current source decreases.

5. The level detector of claim 1, wherein the temperature coefficient adjustment unit is configured to control current that flows through the second node in response to the variable voltage, and to control current that flows through the first node in response to the fixed voltage.

6. An internal voltage generator comprising:
a level detector configured to compare a reference voltage with a sensed voltage that varies based upon temperature and to output a comparative voltage; and
an internal voltage driver configured to adjust an external supply voltage in response to the comparative voltage and to output the internal voltage,
wherein the level detector comprises:
a comparative voltage generator configured to output the comparative voltage in response to a difference between the reference voltage and the sensed voltage; and
a sensed voltage generator comprising a first resistance unit and a second resistance unit connected in series between an output node for the internal voltage and a ground voltage and that outputs the sensed voltage that varies with temperature,
wherein the second resistance unit has a resistance that varies with temperature.

7. The internal voltage generator of claim 6, wherein the second resistance unit comprises a PMOS transistor having a gate to which the ground voltage is applied and having a high threshold voltage, the resistance of the second resistance unit being configured to increase when temperature decreases.

8. The internal voltage generator of claim 6, wherein the second resistance unit comprises an NMOS transistor having a gate to which the internal voltage is applied and having a low threshold voltage, the resistance of the second resistance unit being configured to decrease when temperature decreases.

9. An internal voltage generator comprising:
a level detector configured to compare a reference voltage a sensed voltage that varies based upon temperature and to output a comparative voltage; and
an internal voltage driver configured to adjust an external supply voltage in response to the comparative voltage and to output the internal voltage,
wherein the level detector comprises:
a differential amplifying unit configured to output a differentially amplified comparative voltage at a second node in response to a voltage at a first node that varies based upon a difference between the reference voltage and the sensed voltage; and
a temperature coefficient adjustment unit configured to control current that flows through the first node in response to a variable voltage having a level that varies with temperature, and to control current that flows through the second node in response to a fixed voltage having a level that does not vary with temperature.

10. The internal voltage generator of claim 9, wherein the differential amplifying unit comprises:
a reference voltage generator configured to receive an external constant voltage and output the reference voltage;

a sensed voltage generator configured to output the sensed voltage in response to the internal voltage; and
a differential amplifier driven by a first current source, and configured to output a voltage at the second node that varies based upon the voltage at the first node, as a comparative voltage,
wherein the reference voltage and the sensed voltage do not vary with temperature.

11. The internal voltage generator of claim 10, wherein the temperature coefficient adjustment unit comprises:
a variable voltage generator configured to receive the constant voltage and output the variable voltage that varies with temperature;
a fixed voltage generator configured to receive the constant voltage and output the fixed voltage;
a current controller connected between the first node and the second node and a third fourth node, and configured to control current that flows from the first node to the third node in response to the variable voltage and to control current that flows from the second node to the third node in response to the fixed voltage; and
a second current source connected between the third node and a ground voltage for driving the current controller.

12. The internal voltage generator of claim 11, wherein the internal voltage driver comprises a PMOS transistor connected between the supply voltage and an output terminal for the internal voltage and having a gate to which the comparative voltage is applied, and a third current source connected between the output terminal for the internal voltage and the ground voltage, and
wherein the first current source is a constant current source, and the second current source and the third current source are variable current sources, and
wherein the third current source increases current that flows from the output terminal for an output signal to the ground voltage when current generated by the second current source increases and decreases current that flows from the output terminal for an output signal to the ground voltage when the current generated by the second current source decreases.

13. A semiconductor memory device comprising:
a memory cell array comprising a plurality of memory cells connected between a plurality of word lines and a plurality of bit lines;
a sense amplifier configured to sense and to amplify a signal on a corresponding bit line of the plurality of bit lines in response to a sense enable signal;
a controller configured to receive an internal voltage, to drive a corresponding word line of the plurality of word lines in response to an external command and to output the sense enable signal; and
an internal voltage generator comprising:
a level detector configured to compare a threshold voltage that varies with temperature and the internal voltage to output a comparative voltage, and
an internal voltage driver configured to adjust an external supply voltage in response to the comparative voltage and to output the internal voltage,
the internal voltage generator is configured to output an internal voltage that is lower at low temperature than the internal voltage at high temperature, and
the controller is configured to adjust a delay time until the sense enable signal is output after the word line is driven, using the internal voltage.

14. The semiconductor memory device of claim 13, wherein:

the internal voltage generator is configured to output an internal voltage that is lower at high temperature than the internal voltage at low temperature, and
the controller drives the word line using the internal voltage.

15. A semiconductor memory device comprising:
a memory array comprising a plurality of memory cells connected between a plurality of word lines and a plurality of bit lines;
a sense amplifier configured to sense and to amplify a signal on a corresponding bit line of the plurality of bit lines in response to a sense enable signal;
a controller configured to receive an internal voltage, to drive a corresponding word line of the plurality of word lines in response to an external command, and to output the sense enable signal; and
an internal voltage generator comprising:
a level detector configured to compare a threshold voltage that varies with temperature and the internal voltage to output a comparative voltage, and
an internal voltage driver configured to adjust an external supply voltage in response to the comparative voltage and to output the internal voltage,
a comparative voltage generator configured to output the comparative voltage in response to a difference between a reference voltage and a sensed voltage; and
a sensed voltage generator comprising a first resistance unit and a second resistance unit connected in series between an output node for the internal voltage and a ground voltage and that outputs the sensed voltage that varies with temperature,
wherein the second resistance unit has a resistance that varies with temperature.

16. A semiconductor memory device comprising:
a memory cell array comprising a plurality of memory cells connected between a plurality of word lines and a plurality of bit lines;
a sense amplifier configured to sense and to amplify a signal on a corresponding bit line of the plurality of bit lines in response to a sense enable signal;
a controller configured to receive an internal voltage, to drive a corresponding word line of the plurality of word lines in response to an external command, and to output the sense enable signal; and
an internal voltage generator comprising:
a level detector configured to compare a threshold voltage that varies with temperature and the internal voltage to output a comparative voltage, and
an internal voltage driver configured to adjust an external supply voltage in response to the comparative voltage and to output the internal voltage,
wherein the level detector comprises:
a differential amplifying unit configured to output a differentially amplified comparative voltage to a second node in response to a voltage at a first node that varies with a difference between a reference voltage and a sensed voltage; and
a temperature coefficient adjustment unit configured to control current that flows through the first node in response to a variable voltage having a level that varies with temperature, and to control current that flows through the second node in response to a fixed voltage having a level that does not vary with temperature.

17. The semiconductor memory device of claim 16, wherein the differential amplifying unit comprises:

a reference voltage generator configured to receive an external constant voltage and to output the reference voltage that does not vary with temperature;

a sensed voltage generator configured to output the sensed voltage that does not vary with temperature in response to the internal voltage; and a differential amplifier driven by a first current source, and configured to output a voltage at the second node that varies with the voltage at the first node, as a comparative voltage, wherein the temperature coefficient adjustment unit comprises:

a variable voltage generator configured to receive the constant voltage and output the variable voltage that varies with temperature;

a fixed voltage generator configured to receive the constant voltage and to output the fixed voltage;

a current controller connected between the first and second nodes and a third node, and configured to control current that flows from one the first node to the third node in response to the variable voltage and to control current that flows from the second node to the third node in response to the fixed voltage; and a second current source connected between the third node and a ground voltage for driving the current controller.

18. The semiconductor memory device of claim 17, wherein the internal voltage driver comprises:

a PMOS transistor connected between the supply voltage and an output terminal for the internal voltage and having a gate to which the comparative voltage is applied; and a third current source connected between the output terminal for the internal voltage and the ground voltage, wherein:

the first current source is a constant current source and the second current source and the third current source are variable current sources, and the third current source increases current that flows from the output terminal for an output signal to the ground voltage when current generated by the second current source increases and decreases current that flows from the output terminal for an output signal to the ground voltage when the current generated by the second current source decreases.

19. The semiconductor memory device of claim 16, wherein the temperature coefficient adjustment unit is configured to control current that flows through the second node in response to the variable voltage, and to control current that flows through the first node in response to the fixed voltage.

* * * * *